(12) United States Patent
Arita et al.

(10) Patent No.: US 7,767,551 B2
(45) Date of Patent: Aug. 3, 2010

(54) METHOD FOR FABRICATING SEMICONDUCTOR CHIP

(75) Inventors: Kiyoshi Arita, Fukuoka (JP); Hiroshi Haji, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/160,143

(22) PCT Filed: Oct. 5, 2007

(86) PCT No.: PCT/JP2007/070016

§ 371 (c)(1),
(2), (4) Date: Jul. 7, 2008

(87) PCT Pub. No.: WO2008/044778

PCT Pub. Date: Apr. 17, 2008

(65) Prior Publication Data

US 2009/0004780 A1    Jan. 1, 2009

(30) Foreign Application Priority Data

Oct. 6, 2006    (JP) .............................. 2006-274938

(51) Int. Cl.
    *H01L 21/00* (2006.01)
(52) U.S. Cl. .................... 438/460; 438/462; 438/463; 438/464
(58) Field of Classification Search .......... 438/460–465
    See application file for complete search history.

(56) References Cited

U.S. PATENT DOCUMENTS

| 5,631,190 | A | 5/1997 | Negley |
| 5,912,477 | A | 6/1999 | Negley |
| 6,969,669 | B2 * | 11/2005 | Arita .......................... 438/460 |
| 2006/0024924 | A1 | 2/2006 | Haji et al. |
| 2007/0148803 | A1 * | 6/2007 | Yakushiji et al. .............. 438/33 |
| 2009/0197393 | A1 | 8/2009 | Haji et al. |
| 2010/0055875 | A1 | 3/2010 | Haji et al. |

FOREIGN PATENT DOCUMENTS

| JP | 51-22449 B | 7/1976 |
| JP | 53-121468 A | 10/1978 |
| JP | 53-147468 A | 12/1978 |
| JP | 58-38935 B | 8/1983 |

(Continued)

OTHER PUBLICATIONS

International Search Report Mar. 19, 2008.

(Continued)

*Primary Examiner*—William M Brewster
*Assistant Examiner*—Wilner Jean Baptiste
(74) *Attorney, Agent, or Firm*—Pearne & Gordon LLP (57) ABSTRACT

After a film layer 6 formed from a die attach film 4 and a UV tape 5 has been provided as a mask on a semiconductor wafer 1, boundary trenches 7 for partitioning semiconductor elements 2 formed on a circuit pattern formation surface 1a are formed in the film layer 6, thereby making a surface 1c of a semiconductor wafer 1 exposed. The exposed surface 1c of the semiconductor wafer 1 in the boundary trenches 7 is etched by means of plasma of a fluorine-based gas, and the semiconductor wafer 1 is sliced into semiconductor chips 1' along the boundary trenches 7.

7 Claims, 8 Drawing Sheets

FOREIGN PATENT DOCUMENTS

| | | |
|---|---|---|
| JP | 11-505666 A | 5/1999 |
| JP | 2005-116739 A | 4/2005 |
| JP | 2005-191039 | 7/2005 |
| JP | 2005-203401 | 7/2005 |
| JP | 2005-294535 | 10/2005 |
| JP | 2006-108339 A | 4/2006 |
| JP | 2006-210577 | 8/2006 |
| JP | 2008-53417 A | 3/2008 |

OTHER PUBLICATIONS

Japanese Office Action dated Apr. 9, 2010.

* cited by examiner

METHOD FOR FABRICATING SEMICONDUCTOR CHIP

TECHNICAL FIELD

The present invention relates to a semiconductor chip fabrication method for fabricating semiconductor chips by slicing a semiconductor wafer through use of plasma dicing.

BACKGROUND ART

A related-art process for fabricating a semiconductor includes forming a plurality of semiconductor elements on a circuit pattern formation surface of a semiconductor wafer and subsequently slicing (cutting) the semiconductor wafer, in a mechanical manner, so as to separate the semiconductor elements from each other. A fabricated semiconductor chip is bonded to a leadframe, a substrate, and the like, by means of an epoxy-resin-based liquid adhesive. However, a film-shaped adhesive called a die attach film (DAF) which is easy to handle in connection with a thin semiconductor chip has recently been used.

The die attach film is affixed to a rear surface of a semiconductor wafer (i.e., a surface opposite to a circuit pattern formation surface) before mechanical dicing of the semiconductor wafer and mechanically sliced in conjunction with the semiconductor wafer. For the reason, each of sliced semiconductor chips has the die attach film which is essentially equal in size to the semiconductor chip, and the semiconductor chips can be bonded, just as they are, to a leadframe, a substrate, and the like.

Plasma dicing which is a dicing technique imposing no load on a semiconductor wafer has recently gained attention as a technique which enables performance of dicing operation without imposing a bend, warpage, and the like, on a semiconductor wafer has been slimmed down to a thickness of tens of micrometers or thereabouts. Plasma dicing includes forming boundary trenches—which partition semiconductor elements—in a resist film formed over the semiconductor wafer and etching (engraving) a surface of the semiconductor wafer exposed through the boundary trenches by means of a fluorine-based gas plasma, thereby separating the semiconductor wafer into semiconductor chips. In addition to a photolithography method for transferring a mask pattern—into which boundaries among semiconductor elements (areas among adjacent semiconductor elements) are to be etched—by means of exposure and developing the thus-exposed mask pattern, a method for cutting the resist film by means of emitting a laser beam to boundaries among semiconductor elements has been known in connection with formation of boundary trenches (Patent Document 1). Since the latter method does not need use of an expensive exposure transfer apparatus, plasma dicing can be carried out at low cost. Using a die attach film in lieu of a resist film has also been proposed (Patent Document 2).

[Patent Document 1] JP-A-2005-191039
[Patent Document 2] JP-A-2006-210577
[Patent Document 3] JP-A-2005-203401
[Patent Document 4] JP-A-2005-294535

DISCLOSURE OF THE INVENTION

Incidentally, when a die attach film is exposed to a high-temperature environment which is at a temperature of 100° C. or higher, curing reaction usually proceeds, whereupon the film does not exhibit sufficient function as a bonding agent. For this reason, affixing of a semiconductor wafer before performance of plasma dicing as described in Patent Document 2 is unrealistic. In the meantime, when an attempt is made to subject a plasma-diced semiconductor chip to bonding by means of a die attach film, a small piece of die attach film is affixed to each of the semiconductor chips after separation of the semiconductor wafer into the pieces of semiconductor chips by means of plasma dicing, and the thus-affixed small piece of the die attach film must be shaped to the size of the semiconductor chip. However, accurately shaping the small piece of the die attach film affixed to the minute semiconductor chip is extremely difficult, and difficulty has been encountered in essentially attaining both plasma dicing and bonding involving use of a die attach film.

Moreover, plasma dicing also entails a problem of contamination of a vacuum chamber for plasma processing with organic compounds which arise during a process for ashing (incineration removal) of a resist film, and measures against the problem has been the urgent necessity.

Accordingly, the present invention aims at providing a method for fabricating a semiconductor chip which enables achievement of both plasma dicing and bonding involving use of a die attach film and which enables prevention of contamination of the inside of a vacuum chamber for plasma processing.

According to the present invention, a method for fabricating a semiconductor chip, comprises: a masking step of providing as a mask, on a mask formation surface opposite a circuit pattern formation surface of a semiconductor wafer, a film layer formed from a die attach film to be fixed to the mask formation surface and a heat-resistant film to be affixed to an exterior surface of the die attach film; a boundary trench forming step of forming, in the film layer provided on the semiconductor wafer, boundary trenches for portioning semiconductor elements formed on the circuit formation pattern formation surface of the semiconductor wafer, to thus make a surface of the semiconductor wafer exposed through the boundary trenches; and a plasma etching step of etching the surface of the semiconductor wafer exposed through the boundary trenches by means of plasma of a fluorine-based gas, to thus separate the semiconductor wafer into semiconductor chips along the boundary trenches.

Additionally, a method for fabricating a semiconductor chip may includes affixing a protective film for protecting the semiconductor elements onto the circuit pattern formation surface of the semiconductor wafer before a masking step; affixing a die bonding tape to an exterior surface of the film layer after the plasma etching step; and removing the protective film from the circuit pattern formation surface of the semiconductor wafer.

Additionally, a method for fabricating a semiconductor chip may includes performance, after the plasma etching step, of processing pertaining to a adhesive strength decreasing step for decreasing adhesive strength acting between a die attach film and a heat-resistant film.

Additionally, a method for fabricating a semiconductor chip may includes performance of processing pertaining to the adhesive strength decreasing step after removal of the protective film from the circuit pattern formation surface of the semiconductor wafer.

Additionally, a method for fabricating a semiconductor chip may includes forming the heat-resistant film from a UV tape.

Additionally, a method for fabricating a semiconductor chip may includes performing formation of the boundary trenches in the film layer in the boundary trench formation step by cutting the film layer through use of a laser beam.

Additionally, a method for fabricating a semiconductor chip may includes performing, between the boundary trench formation step and the plasma etching step, processing pertaining to a boundary trench surface smoothing step for smoothing surfaces of the boundary trenches formed in the film layer by means of plasma of an oxygen gas or plasma of a gas mixture containing oxygen as a principal ingredient.

According to the present invention, a film layer formed from a die attach film to be fixed to a mask formation surface and a heat-resistant film to be affixed to an exterior surface of the die attach film is provided as a mask, on the mask formation surface opposite a circuit pattern formation surface of a semiconductor wafer, and the semiconductor wafer is subjected to plasma etching. At a point in time when plasma etching is completed, the die attach film which is essentially equal in size to the semiconductor chip remains affixed to each of the semiconductor chips. Therefore, according to the present invention, there is no necessity for affixing a small piece of a die attach film to a semiconductor chip after plasma dicing or further shaping the thus-affixed die attach film to the size of the semiconductor chip, as in the related art. After the plasma etching step, the semiconductor chip can be bonded, as it is, to a leadframe, a substrate, and the like, so long as the adhesive force acting between the die attach film and the heat-resistant film. Accordingly, both plasma dicing and bonding involving use of the die attach film 4 can be performed simultaneously.

The die attach film used as a mask in plasma etching is used, as it is, as an adhesive for a leadframe, a substrate, and the like, after removal of the heat-resistant film. Accordingly, a step of removal (ashing) of a resist film, which is indispensable for related-art plasma dicing, becomes unnecessary, and contamination of the inside of a vacuum chamber for plasma processing, which would otherwise be caused during the course of removal of a resist film, can be prevented.

BEST MODE FOR IMPLEMENTING THE INVENTION

An embodiment of the present invention will be described hereunder by reference to the drawings. The configuration of a laser beam machining apparatus 10 and a plasma processing apparatus 30 used in implementation of the method for fabricating a semiconductor chip of an embodiment of the present invention will first be described by reference to FIGS. 1 and 2.

Figure 1:
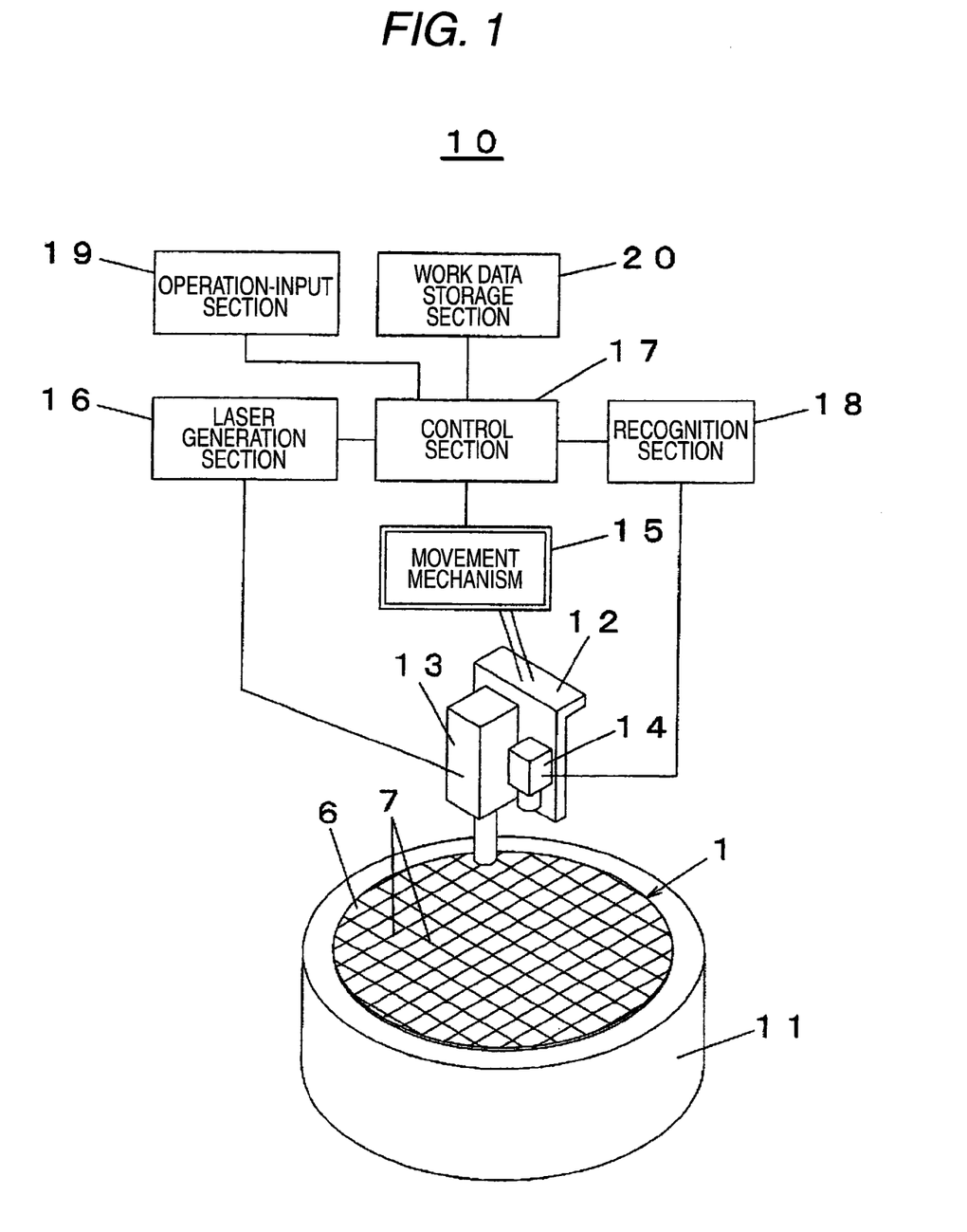
FIG. 1 is a perspective view of a laser beam machining apparatus used in practice of a method for fabricating a semiconductor chip of an embodiment of the present invention.

In FIG. 1, the laser beam machining apparatus 10 includes a wafer holding section 11 for holding in a level position a semiconductor wafer 1 which is an object of processing; a moving plate 12 provided in a movable manner at an elevated position above the wafer holding section 11; a laser emission section 13 and a camera 14 which are fixed to the moving plate 12; a movement mechanism 15 for moving the moving plate 12; a laser generation section 16 for causing the laser emission section 13 to generate a laser beam; a control section 17 for controlling driving of the movement mechanism 15 and generation of a laser beam performed by the laser generation section 16; a recognition section 18 for recognizing the position of the semiconductor wafer 1 from an image captured by the camera 14; and an operation-input section 19 for imparting an operation signal and an input signal to the control section 17.

The wafer holding section 11 has a fixing-holding tool, such as a vacuum chuck, for fixedly holding the semiconductor wafer 1 on an upper surface of the wafer holding section, and the semiconductor wafer 1 is fixedly held with its upper surface—which is subjected to laser machining—oriented upwardly by means of the fixing-holding tool. Movement of the moving plate 12 is controlled by the control section 17 by way of the movement mechanism 15, and the laser emission section 13 and the camera 14 which are fixed to the moving plate 12 are three-dimensionally moved above the semiconductor wafer 1. The laser generation section 16 causes the laser emission section 13 to generate a laser beam 13a under control of the control section 17, and the laser beam 13a generated by the laser emission section 13 is radiated downwardly. The camera 14 captures an image of the semiconductor wafer 1 situated at a position immediately below the camera, by means of infrared radiation. The recognition section 18 recognizes the position of the semiconductor wafer 1 from the image captured by the camera 14, and transmits resultantly-obtained positional information about the semiconductor wafer 1 to the control section 17. In accordance with the positional information about the semiconductor wafer 1 transmitted from the recognition section 18, the control section 17 ascertains a positional relationship between the semiconductor wafer 1 and the laser emission section 13, and computes a position to be irradiated with the laser beam 13a emitted by the laser emission section 13. The operation-input section 19 provides the control section 17 with an operation signal for the movement mechanism 15, an input signal pertaining to operation of the laser emission section 16, and the like.

Figure 2:
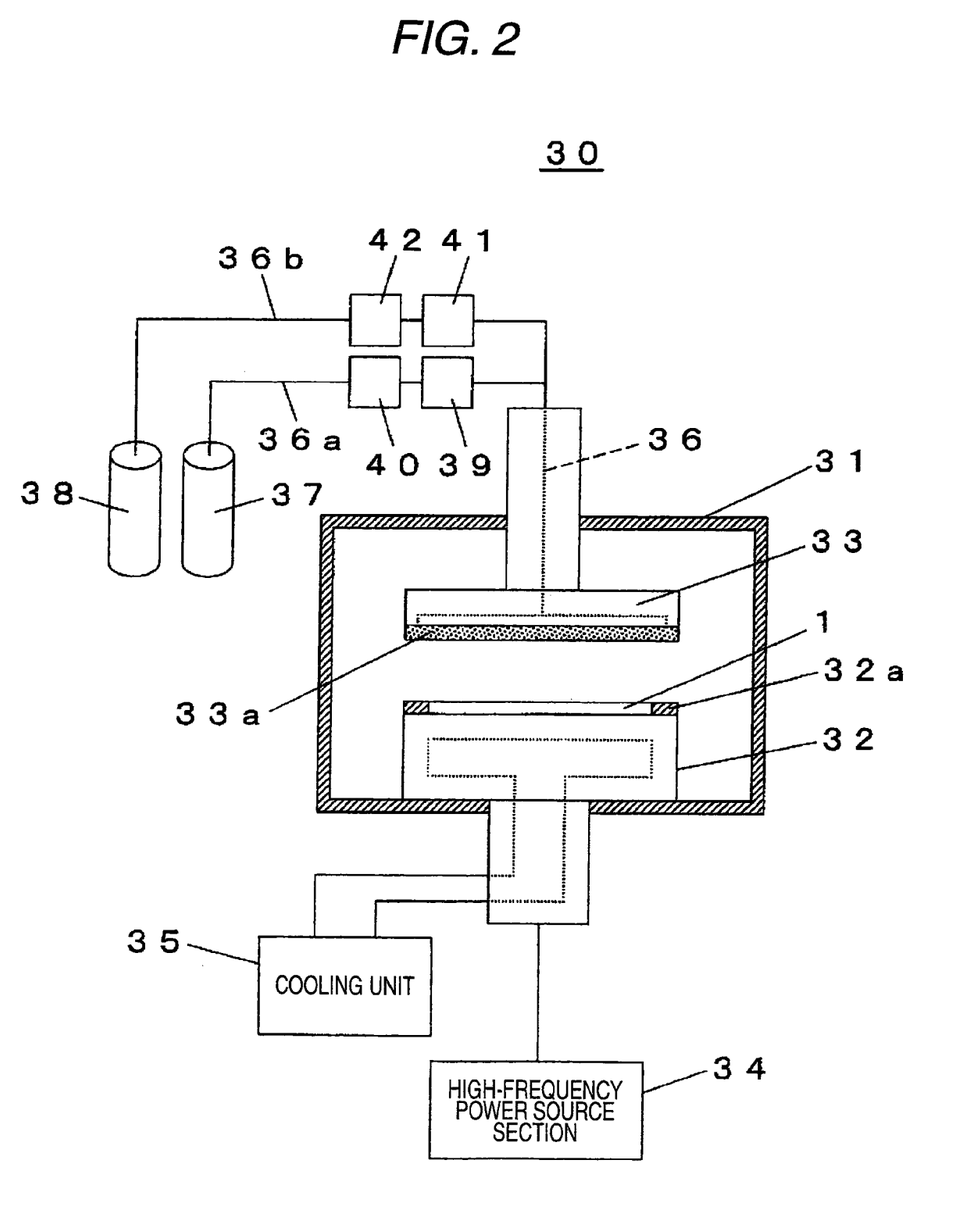
FIG. 2 is a cross-sectional view of a plasma processing apparatus used in practice of the method for fabricating a semiconductor chip of the embodiment of the present invention.

In FIG. 2, a plasma processing apparatus 30 is built from a vacuum chamber 31; a lower electrode 32 and an upper electrode 33 which are provided within the vacuum chamber 31; a high-frequency power source section 34 for applying a high-frequency voltage to the lower electrode 32; a cooling unit 35 for circulating a coolant within the lower electrode 32; a gas feed channel 36 which extends from the inside of the upper electrode 33 to the outside of the vacuum chamber 31 and which is bifurcated outside the vacuum chamber 31; an oxygen gas feed section 37 connected to one branch channel (hereinafter taken as a first branch channel 36a) of the bifurcated gas feed channel 36; a fluorine-based gas feed section 38 connected to the other branch channel (hereinafter taken as a second branch channel 36b) of the bifurcated gas feed channel 36; a first open-close valve 39 and a first flow rate control valve 40 placed at any points in the first branch channel 36a; and a second open-close valve 41 and a second flow rate control valve 42 placed at any points in the second branch channel 36b.

The inside of the vacuum chamber 31 is an enclosed space for subjecting the semiconductor wafer 1 to plasma processing. The lower electrode 32 is positioned within the vacuum chamber 31 in such a way that a surface of the lower electrode for holding the semiconductor wafer 1 is oriented upwardly, and the upper electrode 33 is positioned in such a way that a lower surface of the upper electrode faces the upper surface of the lower electrode 32 above the lower electrode 32.

A wafer holding mechanism (not shown) built from a vacuum chuck, an electrostatic absorbing mechanism, and the like, and a ring-shaped frame 32a formed from an electrically insulating material are provided on the upper surface of the lower electrode 32. The semiconductor wafer 1 is supported in such a way that a surface of the wafer to be subjected to plasma processing is oriented upwardly and such that surroundings of the wafer are enclosed by the frame 32a; and is fixed on the upper surface of the lower electrode 32 by means of the wafer holding mechanism.

An oxygen gas (a gas mixture containing oxygen as the principal ingredient may also be adopted) is sealed in the oxygen gas feed section 37. When the first open-close valve 39 is opened (i.e., the second open-close valve 41 is closed), the oxygen gas is supplied to the upper electrode 33 by way of the first branch channel 36a and the gas feed channel 36. A flow rate of the oxygen gas supplied from the oxygen gas feed section 37 to the upper electrode 38 is regulated by means of adjusting the degree of opening of the first flow rate control valve 40. Moreover, a fluorine-based gas; for example, sulfur hexafluoride ($SF_6$), and the like, is sealed in the fluorine-based gas feed section 38. When the second open-close value 41 is opened (the first open-close valve 39 is closed), the fluorine-based gas is supplied to the upper electrode 33 by way of the second branch channel 36b and the gas feed channel 36. The flow rate of the fluorine-based gas supplied from the fluorine-based gas feed section 38 to the upper electrode 38 is regulated by means of adjusting the degree of opening of the second flow rate control valve 42.

A flat-plate-like porous plate 33a is provided on a lower surface of the upper electrode 33. The oxygen gas and the fluorine-based gas supplied by way of the gas feed channel 36 are uniformly sprayed over an upper surface of the lower electrode 32 by way of the porous plate 33a.

Figure 3A:
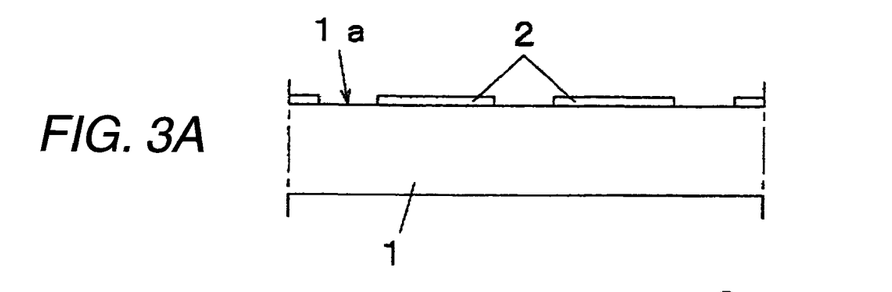
FIGS. 3A to 3D are views for describing processes of the method for fabricating a semiconductor chip of the embodiment of the present invention.

Next, a method for fabricating a semiconductor chip will be described by reference to descriptive flowcharts shown in FIGS. 3 to 6 and a flowchart shown in FIG. 7. In FIG. 3A, a plurality of semiconductor elements 2 are formed on the circuit pattern formation surface 1a of the semiconductor wafer 1 and can be separated into a plurality of semiconductor chips, so long as boundary sections among the adjacent semiconductor elements 2 (areas among the adjacent semiconductor elements 2) are sliced.

Figure 3B:
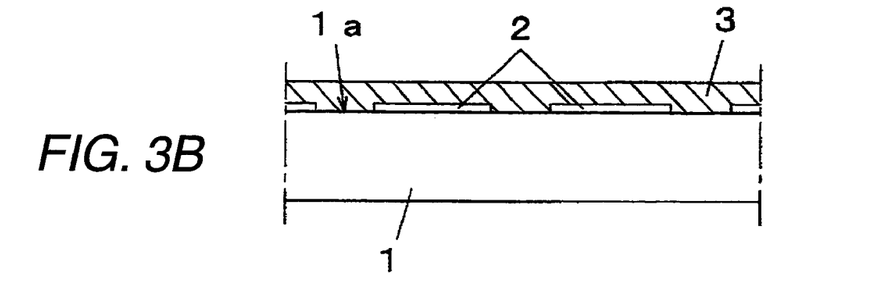

In order to fabricate semiconductor chips from the semiconductor wafer 1, a sheet-shaped protective film (e.g., an UV tape) 3 is affixed to the circuit pattern formation surface 1a of the semiconductor wafer 1 (a protective film affixing step shown in FIG. 7), as shown in FIG. 3B.

Figure 3C:
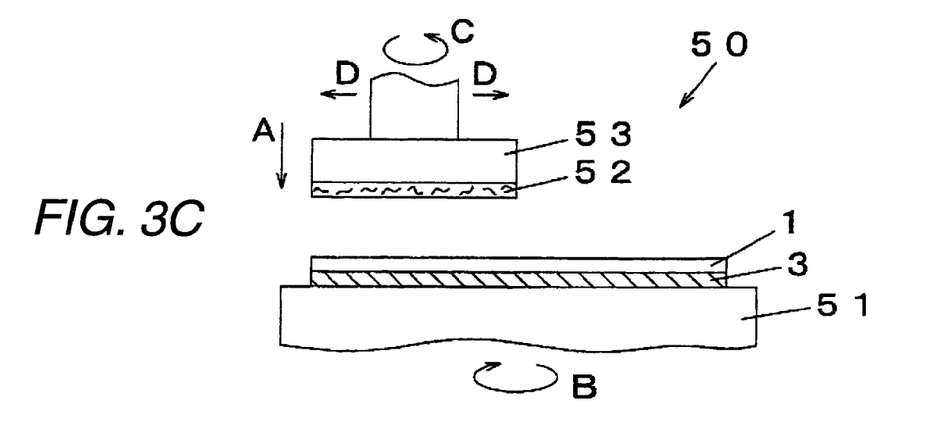
Figure 3D:
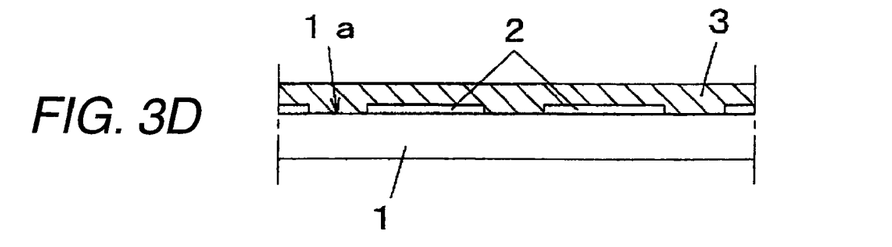
Figure 7:
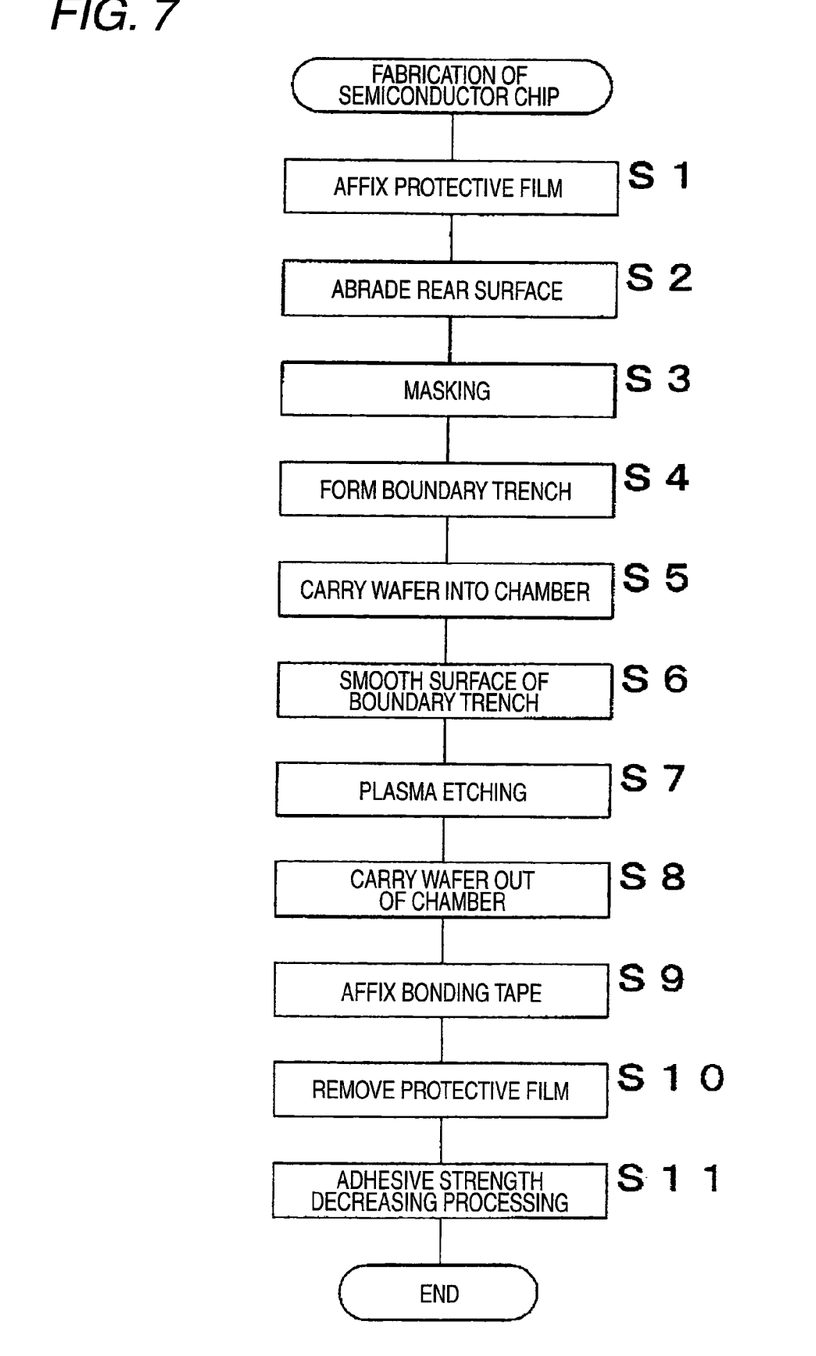
FIG. 7 is a flowchart showing process procedures of the method for fabricating a semiconductor chip of the embodiment of the present invention.

As shown in FIG. 3C, after completion of processing pertaining to the protective film affixing step S1, a rear surface of the semiconductor wafer 1; namely, a surface opposite to the circuit pattern formation surface 1a, is abraded by use of an abrading apparatus 50 (a rear surface abrasion step S2 shown in FIG. 7). The abrading apparatus 50 is built from a rotary table 51 on an upper surface of which the semiconductor wafer 1 is placed in such a way that the rear surface of the semiconductor wafer is oriented upwardly; and an abrasion head 53 which is disposed above the rotary table 51 and to a lower surface of which the abrasive cloth 52 is affixed. The abrasive cloth 52 is pushed against the rear surface of the semiconductor wafer 1 by means of the abrasion head 53 (as indicated by arrow A shown in FIG. 3C), and the abrasion head 53 is swayed within a horizontal plane (as indicated by arrow D shown in FIG. 3C) while the rotary table 51 and the abrasion head 53 are being rotated around the vertical axis (as indicated by arrows B and C shown in FIG. 3C). As a result, the semiconductor wafer 1 whose thickness is reduced to about 100 to 30 μm as a result of abrasion of the rear surface is acquired (FIG. 3D).

Figure 4A:
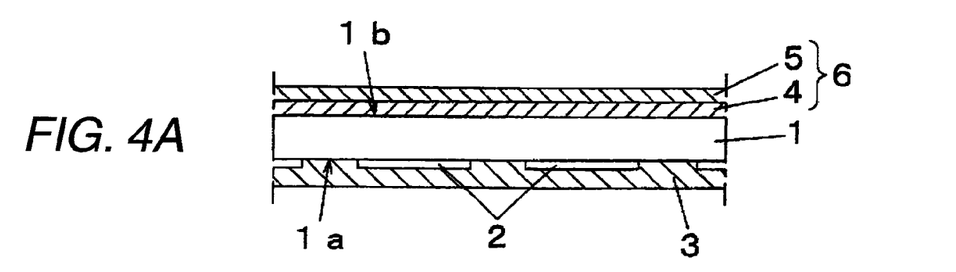
FIGS. 4A to 4C are views for describing processes of the method for fabricating a semiconductor chip of the embodiment of the present invention.

As shown in FIG. 4A, after completion of processing pertaining to the rear surface abrasion step S2, a film layer 6 formed from a die attach film 4 to be fixed to a mask formation surface 1b and the UV tape 5 serving as a heat-resistant film to be affixed to an exterior surface of the die attach film 4 is provided, on the mask formation surface 1b opposite the circuit pattern formation surface 1a of the semiconductor wafer 1 (i.e., the rear surface of the semiconductor wafer 1), as a mask employed in a plasma etching step S7 to be described later (a masking step S3 shown in FIG. 7). In the masking step S3, the die attach film 4 having the UV tape 5 previously affixed to an exterior surface thereof may also be affixed to the semiconductor wafer 1. First, only the die attach film 4 is affixed to the semiconductor wafer 1, and subsequently the UV tape 5 may also be affixed to the exterior surface of the die attach film 4.

Figure 4B:
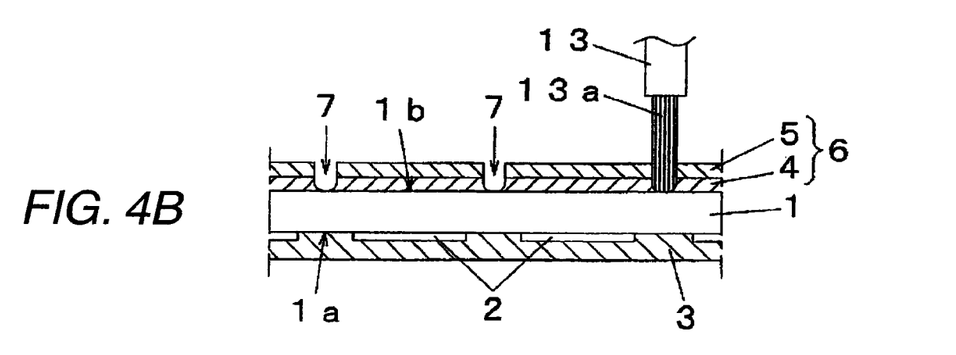
Figure 4C:
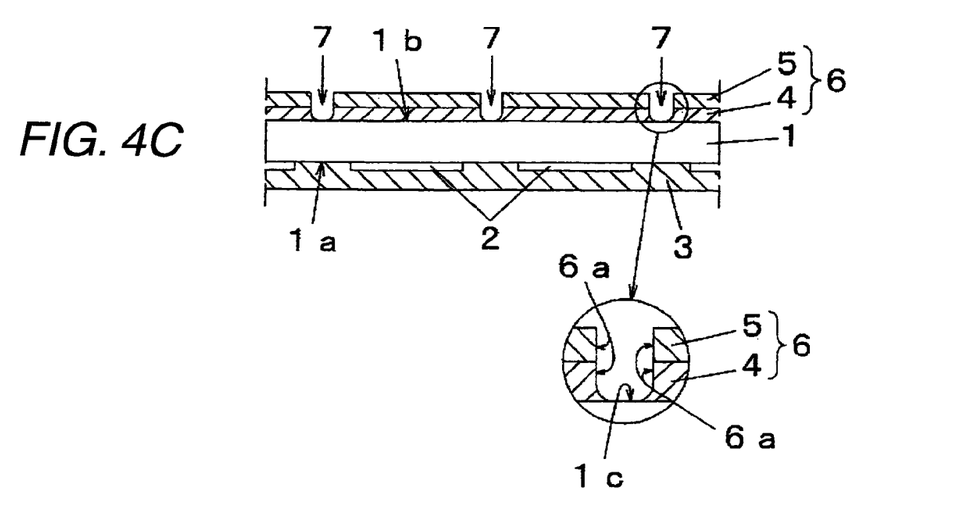

The semiconductor wafer 1 is placed on the wafer holding section 11 of the laser beam machining apparatus 10 after completion of processing pertaining to the masking step S3. At the time, the surface of the semiconductor wafer 1 on which the film layer 6 is provided is oriented upwardly As shown in FIGS. 4B and 4C, the laser beam 13a is radiated onto the boundary sections among the semiconductor elements 2 (i.e., the areas among the adjacent semiconductor elements 2) of the film layer 6, to thus cut the film layer 6 located in the boundary sections. Thus, the boundary trenches 7 partitioning the semiconductor elements 2 are formed in the film layer 6 (a boundary trench formation step S4 shown in FIG. 7).

Laser machining is performed while the laser beam 13a is being moved relatively to the semiconductor wafer 1. Data pertaining to the positions of the boundary trenches 7 are stored in a work data storage section 20 of the laser machining apparatus 10, and the control section 17 moves the laser emission section 13 in accordance with the data stored in the work data storage section 20. Specifically, the control section 17 compares the position irradiated with the laser beam 13a through the camera 14 and the recognition section 18 with the data pertaining to the positions of the boundary trenches 7 stored in the work data storage section 20, and the movement mechanism 15 is driven in such a way that the position irradiated with the laser beam 13a moves along the boundary trenches 7 stored in the work data storage section 20. Data pertaining to the width of the boundary trench 7 are also stored in the work data storage section 20. When causing the laser beam emission section 13 to emit the laser beam 13a, the control section 17 adjusts a beam size of the laser beam 13a by means of changing an output of the laser emission section 13, in such a way that the width of the actually-formed boundary trench 7 becomes slightly smaller than the width of the boundary trench 7 stored in the work data storage section 20.

After completion of processing pertaining to the boundary trench formation step S4, the semiconductor wafer 1 is removed from the wafer holding section 11 of the laser machining apparatus 10; the thus-removed semiconductor wafer is carried into the vacuum chamber 31 of the plasma processing apparatus 30; and the semiconductor wafer 1 is fixed onto the upper surface of the lower electrode 32 (a wafer carrying-in step S5 shown in FIG. 7). At the time, the surface of the semiconductor wafer 1 on which the film layer 6 is provided is oriented upwardly.

Figure 8A:
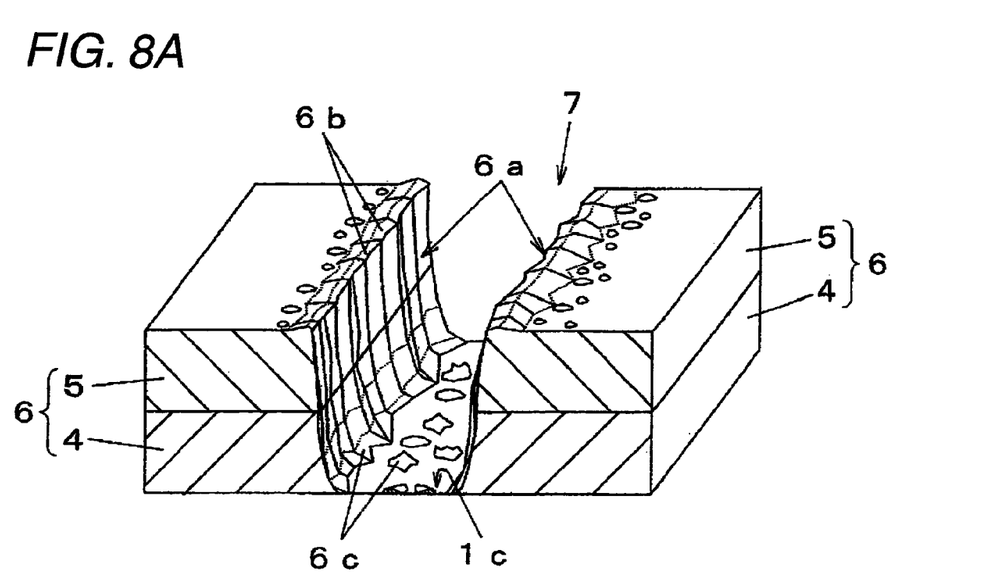
FIGS. 8A and 8B are views showing changes in the surface of a boundary trench arising before and after a process for smoothing the surface of the boundary trench practiced under the method for fabricating a semiconductor chip of the embodiment of the present invention.

In the stage, the laser-processed surfaces of the boundary trenches 7 assume an acutely-serrated, irregular shape. The term "surfaces of the boundary trenches 7" mean two mutually-opposing cut surfaces 6a of the film layer 6 generated as a result of cutting of the film layer 6 by means of the laser beam 13a and the surface 1c of the semiconductor wafer 1 exposed through the boundary trenches 7 and between the two cut surfaces 6a (see a partially-enlarged view in FIG. 4C). The reason why the surfaces of the boundary trenches 7 assume a serrated irregular shape is because irregular portions 6b arise in the cut surfaces 6a as a result of the film layer 6 being cut by means of a pulsating laser beam 13a; because residues 6c of the film layer 6 splashed around during cutting of the film layer 6 adhere to the surfaces of the boundary trenches 7; and the like (FIG. 8A).

When plasma etching is immediately performed in the state, cut side surfaces of the semiconductor chips also become serrated, and stress concentration is likely to arise. Therefore, when the semiconductor wafer 1 is carried into the vacuum chamber 31, the surfaces of the boundary grooves 7 given an irregular shape in the boundary groove formation step S4 are smoothed by means of a plasma of an oxygen gas generated in the vacuum chamber 31 before plasma etching is performed (a boundary groove surface smoothing step S6 shown in FIG. 7).

Figure 5A:
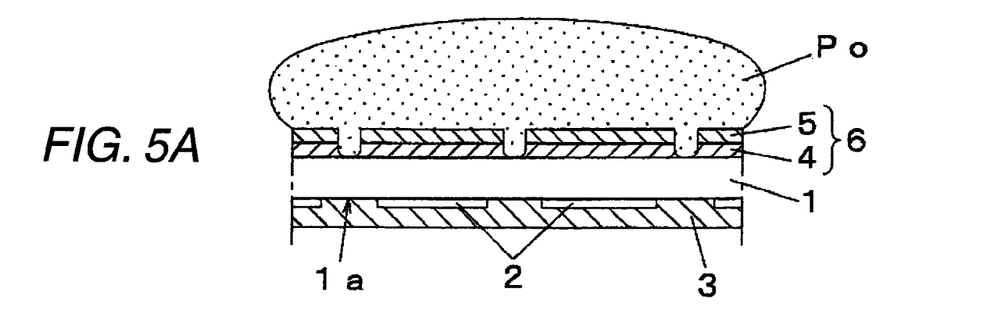
FIGS. 5A to 5D are view for describing processes of the method for fabricating a semiconductor chip of the embodiment of the present invention.
Figure 5B:
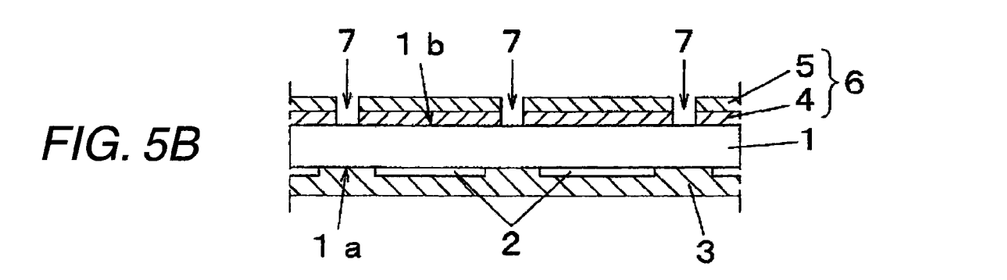

In the boundary trench surface smoothing step S6, the first open-close valve 39 is first opened while the second open-close valve 41 of the plasma processing apparatus 30 is closed, and an oxygen gas is supplied from the oxygen gas feed section 37 to the upper electrode 33. As a result, an oxygen gas is sprayed, from the upper electrode 33, over the upper surface of the semiconductor wafer 1 by way of the porous plate 33a. The high-frequency power source section 34 is driven in the state, to thus apply a high-frequency voltage to the lower electrode 32, whereupon plasma Po of the oxygen gas develops between the lower electrode 32 and the upper electrode 33 (FIG. 5A). The plasma Po of the oxygen gas is an organic substance and, hence, incinerates the film layer 6 (the UV tape 5 and the die attach film 4), and hence the surface of the boundary trenches 7 are smoothed (FIGS. 5B and 8B).

Figure 8B:
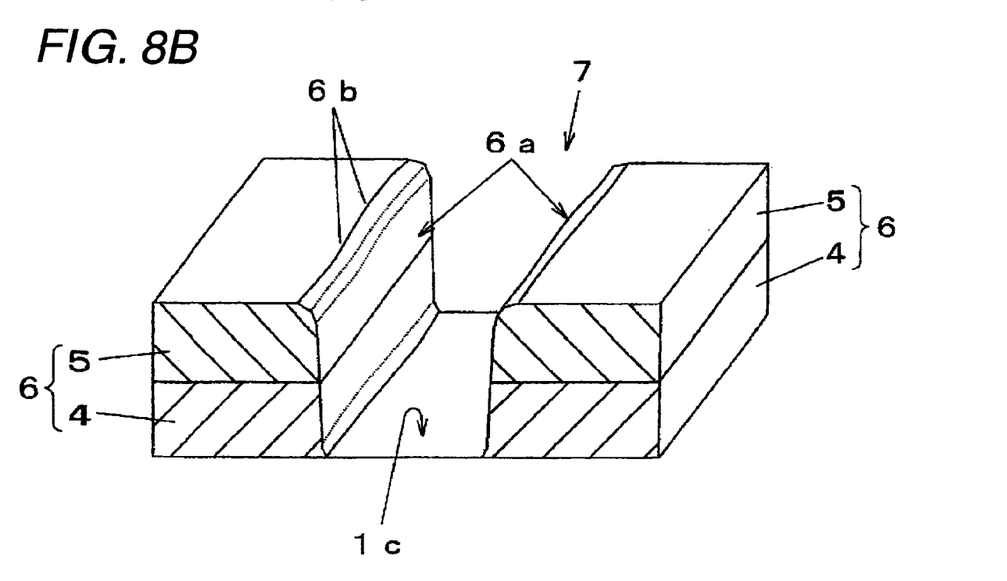

Specifically, the surfaces of the boundary trenches 7 are smoothed by means of: removing the irregular portions 6b (the two mutually-opposing cut surfaces 6a of the film layer 6) from the surfaces of the boundary trenches 7 by means of the plasma Po of the oxygen gas (or a gas mixture containing an oxygen gas as the principal ingredient); removing the residues 6c of the film layer 6 adhering to the surfaces of the boundary grooves 7; and making the irregular portions 6b (the tow mutually-opposing cut surfaces 6a) of the surfaces of the boundary trenches 7 uniform, to thus increase a period between irregularities of the irregular portions 6b (see FIG. 8B). During a period in which the surfaces of the boundary trenches 7 are smoothed by means of the plasma of the oxygen gas, the cooling unit 35 is driven to circulate the coolant within the lower electrode 32, thereby preventing an increase in the temperature of the semiconductor wafer 1, which would otherwise be caused by the heat of the plasma.

The longer a period of time during which the film layer 6 is exposed to the plasma Po of the oxygen gas, the faster a progress in incineration of the film layer 6. However, a period of time during which the film layer 6 is exposed to the plasma Po of the oxygen gas in the boundary trench surface smoothing step S6 is set to a minimum period of time required to smooth the surfaces of the boundary trenches 7 of the film layer 6. As an index of an exposure time, a period of time during which the exterior surface of the film layer 6 (i.e., the UV tape 5) is removed by an amount of the order of 1 to 3 μm is preferable.

After completion of processing pertaining to the boundary trench surface smoothing step S6, there is performed plasma etching for separating the semiconductor wafer 1 into semiconductor chips along the boundary trenches 7 by means of the plasma of a fluorine-based gas (a plasma etching step S7 shown in FIG. 7). At this time, the film layer 6 provided on the semiconductor wafer 1 acts as a mask.

Figure 5C:
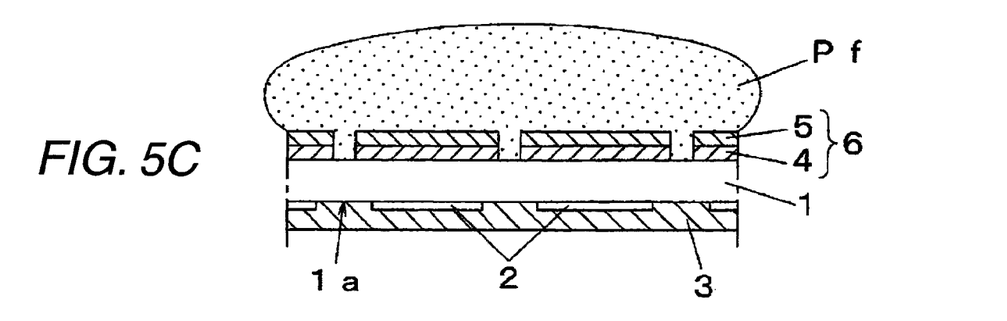

In the plasma etching step S7, the second open-close valve 41 is opened while the first open-close valve 39 remains switched from the OPEN position to the CLOSE position, thereby supplying the fluorine-based gas from the fluorine-based bas feed section 38 to the upper electrode 33. As a result, the fluorine-based gas is sprayed from the upper electrode 33 over the upper surface of the semiconductor wafer 1 by way of the porous plate 33a. When the high-frequency power source section 34 is driven in the state, to thus apply a high-frequency voltage to the lower electrode 32, plasma Pf of the fluorine-based gas develops between the lower electrode 32 and the upper electrode 33 (FIG. 5C).

Figure 5D:
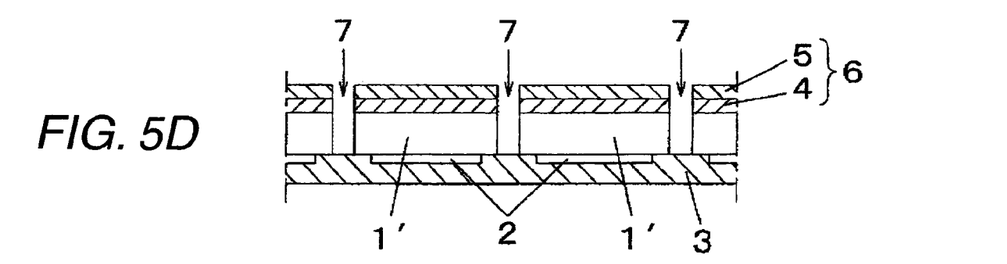

Since the thus-developed plasma Pf of the fluorine-based gas etches the surface 1c of the semiconductor wafer 1 that is exposed through the boundary trenches 7 and is made of silicon, the semiconductor wafer 1 is sliced along the boundary trenches 7 by one operation, whereupon a plurality of semiconductor chips 1' are generated (FIG. 5D). In the middle of the surface 1c of the semiconductor wafer 1 being etched by the plasma Pf of the fluorine-based gas, the cooling unit 35 is driven to circulate the coolant within the lower electrode 32, thereby preventing an increase in the temperature of the semiconductor wafer 1, which would otherwise be caused by the heat of the plasma.

Since the surfaces of the boundary trenches 7 have already been smoothed in the preceding step (the boundary trench surface smoothing step S6), the cut surfaces of the semiconductor wafer 1 formed by means of plasma etching; namely, the side surfaces of the semiconductor chips 1', become flat. Further, since plasma etching proceeds from the boundary trenches 7 that are taken as the starting points, each of the sliced semiconductor chips 1' becomes essentially equal in size to the die attach film 4 affixed to each semiconductor chip 1'.

Figure 6A:
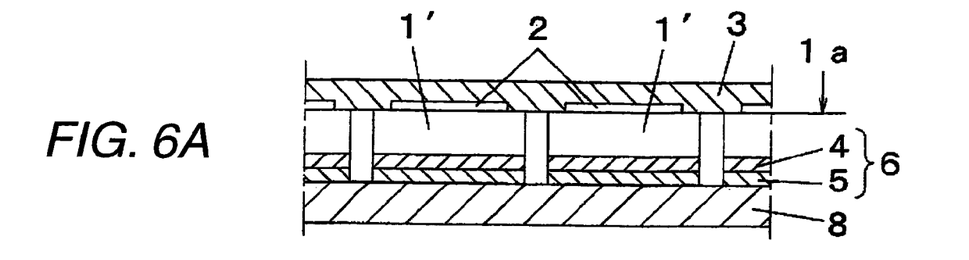
FIGS. 6A to 6D are views for describing processes of the method for fabricating a semiconductor chip of the embodiment of the present invention.

After completion of processing pertaining to the plasma etching step S7, the semiconductor wafer 1 (i.e., the sliced semiconductor chips 1' remain connected together by means of the protective film 3) is carried out of the vacuum chamber 31 (a wafer carrying-out step S8 shown in FIG. 7). After carrying out of the semiconductor wafer 1 from the vacuum chamber 31, the semiconductor wafer 1 is positioned in such a way that the side of the wafer to which the protective film 3 is affixed faces upward, as shown in FIG. 6A, and a die bonding tape 8 is affixed to the UV tape 5 on the lower surface of the wafer (a bonding tape affixing step S9 shown in FIG. 7).

Figure 6B:
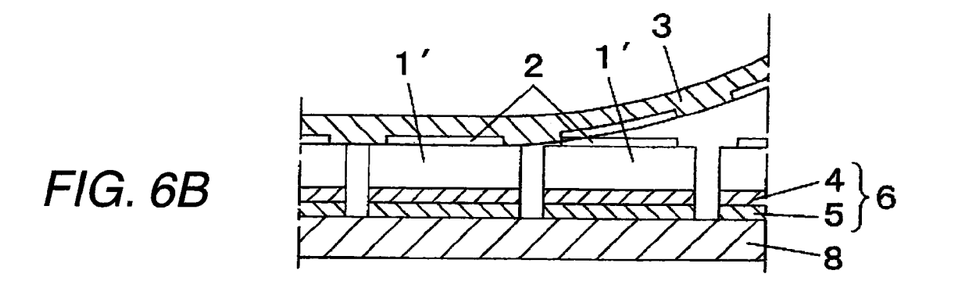

After completion of processing pertaining to the bonding tape affixing step S9, the protective film 3 affixed to the circuit pattern formation surface 1a of the semiconductor wafer 1 is removed by pulling, as shown in FIG. 6B (a protective film removal step S10 shown in FIG. 7). As a result, the die attach film 4 that is essentially equal in size to the semiconductor chip 1' is provided on a lower surface of each semiconductor chips 1' (i.e., the rear surface of the semiconductor wafer 1). By virtue of the adhesive strength acting between the die attach film 4 and the UV tape 5 and the adhesive strength acting between the UV tape 5 and the die bonding tape 8, the semiconductor chip 1' is held on the upper surface of the die bonding tape 8 by way of the die attach film 4.

Figure 6C:
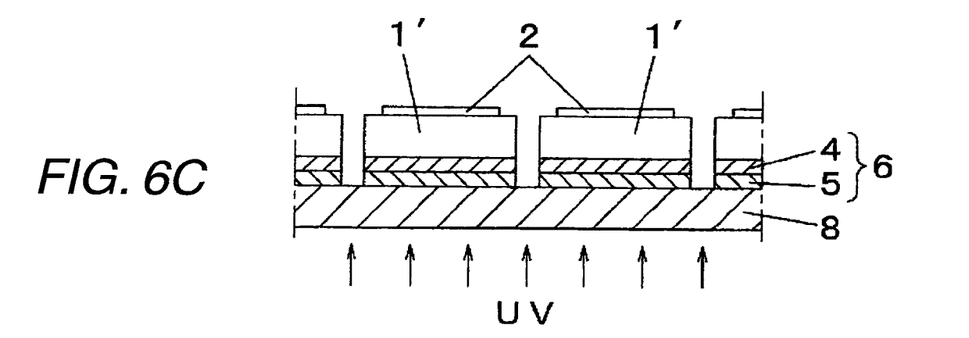
Figure 6D:
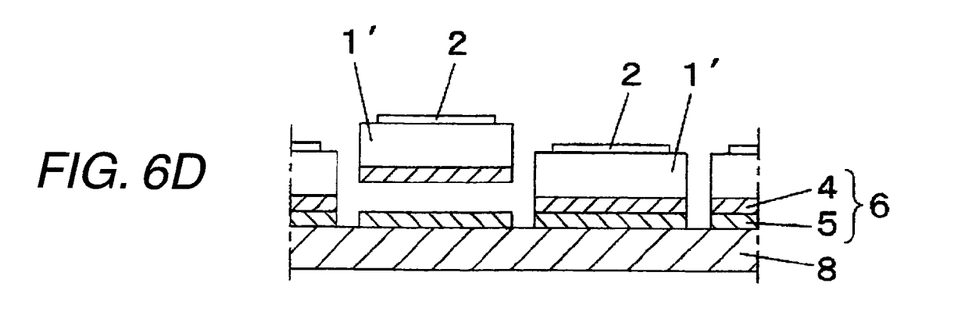

After completion of processing pertaining to the protective film removal step S10, the adhesive strength acting between the die attach film 4 and the heat-resistant film (the UV tape 5) is decreased (an adhesive strength decreasing step S11). Processing for decreasing the adhesive strength acting between the die attach film 4 and the heat-resistant film in the adhesive strength decreasing step S11 is performed by means of exposure of the UV tape 5 to UV radiation when the heat-resistant film is the UV tape 5 as described in connection with the present embodiment (FIG. 6C). The adhesive strength of the UV tape 5 acting on the die attach film 4 is weakened in the adhesive strength decreasing step S11, and the respective semiconductor chips 1' having the die attach films 4 provided on the lower surfaces thereof can be readily detached from the die bonding tape 8. The semiconductor chips 1'—which have the die attach films 4 and which can have become detached from the die bonding tape 8 as mentioned above—are picked up by an unillustrated pickup mechanism and bonded to a leadframe, a substrate, and the like.

As mentioned above, under the method for fabricating a semiconductor chip of the present embodiment, the film layer 6 formed from the die attach film 4 to be fixed to the mask formation surface 1b and the UV tape 5 serving as a heat-resistant film to be affixed to the exterior surface of the die attach film 4 is provided as a mask, on the mask formation surface 1b opposite the circuit pattern formation surface 1a of the semiconductor wafer 1; and the semiconductor wafer 1 is subjected to plasma etching. At a point in time when processing pertaining to the plasma etching step S7 is completed, the die attach film 4 which is essentially equal in size to the semiconductor chip 1' remains affixed to each of the semiconductor chips 1'. Therefore, according to the method for fabricating a semiconductor chip of the present embodiment, there is no necessity for affixing a small piece of a die attach film to a semiconductor chip after plasma dicing or further shaping the thus-affixed die attach film to the size of the semiconductor chip, as in the related art. After the plasma etching step S7, the semiconductor chip can be bonded, as it is, to a leadframe, a substrate, and the like, so long as the adhesive force acting between the die attach film 4 and the UV tape 5. Accordingly, both plasma dicing and bonding involving use of the die attach film 4 can be performed simultaneously.

The die attach film 4 used as a mask in the plasma etching step S7 is used, as it is, as an adhesive for a leadframe, a substrate, and the like, after removal of the heat-resistant film (the UV tape 5). Accordingly, a step of removal (ashing) of a resist film, which is indispensable for related-art plasma dicing, becomes unnecessary, and contamination of the inside of the vacuum chamber 31 for plasma processing, which would otherwise be caused during the course of removal of a resist film, can be prevented.

The method for fabricating a semiconductor chip of the present embodiment is chiefly characterized in that the UV tape 5 is used while the die attach film 4 bonded to the exterior surface is taken as mask.

Since the die attach film 4 is generally vulnerable to heat and does not exhibit sufficient function as a bonding agent upon exposure to a temperature environment of 80° or higher, use of the die attach film as a mask for plasma etching practiced in a high-temperature environment is usually not conceived. However, the inventors of the present patent application found that the temperature of the die attach film 4 could be held at a temperature which is equal to or lower than 80° C. even during plasma etching which is performed in a high-temperature environment, so long as the exterior surface of the die attach film 4 affixed to the semiconductor wafer 1 is sheathed with a heat-resistant film (the UV tape 5 that is an example), and finally completed the present invention. The die attach film 4 can be prevented from coming to a high temperature of 80° C. or more, by means of sheathing the die attach film 4 with the UV tape 5. However, so long as the semiconductor wafer 1 is cooled by means of the cooling unit 35 as described in connection with the present embodiment, an increase in the temperature of the die attach film 4 can be prevented more reliably.

As in the case of the method for fabricating a semiconductor chip of the present embodiment, so long as the protective film 3 for protecting the semiconductor elements 2 is affixed to the circuit pattern formation surface 1a of the semiconductor wafer 1 before the masking step S3; the die bonding tape 8 is affixed to the exterior surface of the film layer 6 after the plasma etching step S7; and the protective film 3 is removed from the circuit pattern formation surface 1a of the semiconductor wafer 1, the semiconductor elements 2 fabricated on the circuit pattern formation surface 1a can be protected more reliably by means of the protective film 3. Further, even after removal of the protective film 3, the semiconductor chips 1' can be collectively handled by means of the die bonding tape 8. Accordingly, the semiconductor chips 1' can be readily handled after dicing.

Further, in the related art, when a semiconductor chip is die-bonded to a leadframe, a substrate, and the like, an adhesive for die-bonding purpose (corresponding to the die attach film 4 of the present embodiment) becomes fluidized and creeps up to an upper surface along side surfaces of the semiconductor chip, which in turn raises a problem of a nozzle of an electronic component mounting apparatus for picking up a semiconductor chip being stained (the problem has become noticeable in conjunction with slimming-down of a semiconductor chip). Under the method for fabricating a semiconductor chip of the present embodiment, a periphery of the die attach film 4 is exposed directly to a laser beam or plasma. Therefore, a curing reaction proceeds faster in the periphery than in the center, and the periphery becomes cured harder than in the center section. For these reasons, creeping-up of the adhesive resulting from excessive fluidization during die bonding is prevented, and the problems of the related art can be solved.

The preferred embodiment of the present invention has been described thus far, but the present invention is not limited to the previously-described embodiment. For instance, in the previous embodiment, the film layer 6 is cut by means of the laser beam 13a, to thus create the boundary trenches 7. There may also be adopted a method for cutting the film layer 6 by means of a disc-shaped blade which rotates at high speed. However, under the method, as the number of boundary trenches increase, productivity is deteriorated when compared with a case where the laser beam 13a is utilized.

Accordingly, utilization of the laser beam 13a as described in connection with the embodiment is preferable.

So long as the film layer 6 (i.e., the die attach film 4 and the heat-resistant film) can be formed from a photosensitive material, the boundary trenches 7 can also be formed even by means of a photolithographic method under which a mask pattern—in which boundary areas among the semiconductor elements 2 (i.e., the areas among the adjacent semiconductor elements 2) are etched—is transferred onto a resist film through exposure and developed. However, from the viewpoint of obviation of a necessity for an expensive exposure apparatus, the laser machining method described in connection with the previous embodiment can be said to be preferable. In the case of laser machining, the surfaces of the boundary trenches 7 assume an irregular shape which is serrated at acute angles, as mentioned previously. Accordingly, processing pertaining to the boundary trench surface smoothing step S6 for smoothing the surfaces of the boundary trenches 7 formed in the film layer 6 by means of a plasma of an oxygen gas or a plasma of a gas mixture containing oxygen as the principal ingredient is preferably practiced between the boundary trench formation step S4 and the plasma etching step S7.

In the previous embodiment, a UV tape is used as a heat-resistant film to be affixed to an exterior surface of the die attach film 4. However, the reason for the is that the UV tape has a characteristic of ability to sufficiently endure plasma of a fluorine-based gas in a high-temperature environment during plasma etching and to readily reduce the adhesive strength acting between the die attach film 4 and the UV tape by means of a simple method, such as exposure to UV radiation. Consequently, a tape other than the UV tape can also be used as a heat-resistant film, so long as the tape has the same property as that of the UV tape 5 and is formed by combination of a base material formed from a material which can endure plasma of a fluorine-based gas in a high-temperature environment; for example, a polyolefin-based resin, a polyimide-based resin, and the like, and an adhesive whose adhesive strength is decreased by a simple method, such as exposure of an UV tape to UV radiation.

So long as the adhesive for bonding the die bonding tape 8 to the film layer 6 is formed from a UV curable material, the adhesive strength acting between the die bonding tape 8 and the film layer 6 can be increased by means of exposure to UV radiation. Hence, when the protective film 3 is removed in the protective film removal step S10, detachment of the semiconductor chips 1' from the die bonding tape 8 can be prevented.

In the foregoing embodiment, processing pertaining to the adhesive strength decreasing step S11 is performed after the protective film removal step S10. However, processing pertaining to the adhesive strength decreasing step S11 does not necessarily follow the protective film removal step S10, so long as the semiconductor wafer 1 has already been sliced into the respective semiconductor chips 1'. When processing pertaining to the adhesive strength decreasing step S11 is practiced before the protective film removal step S10, there is a potential of the semiconductor chips 1' becoming detached from the die bonding tape 8 at the time of removal of the protective film 3 from the circuit pattern formation surface 1a of the semiconductor wafer 1. Processing pertaining to the adhesive strength decreasing step S11 is performed, to the extent possible, after the protective film removal step S10.

Both plasma dicing and bonding involving use of a die attach film can be performed, and contamination of the inside of the vacuum chamber can also be prevented.

The invention claimed is:

1. A method for fabricating a semiconductor chip, comprising:
    a masking step of providing a mask, on a mask formation surface opposite a circuit pattern formation surface of a semiconductor wafer, a film layer formed from a die attach film to be fixed to the mask formation surface and a heat-resistant film to be affixed to an exterior surface of the die attach film, wherein the die attach film is a film-shape adhesive;
    a boundary trench forming step of forming, in the film layer provided on the semiconductor wafer, boundary trenches for portioning semiconductor elements formed on the circuit formation pattern formation surface of the semiconductor wafer, to thus make a surface of the semiconductor wafer exposed through the boundary trenches; and
    a plasma etching step of etching the surface of the semiconductor wafer exposed through the boundary trenches by means of plasma of a fluorine-based gas, to thus separate the semiconductor wafer into semiconductor chips along the boundary trenches.

2. The method for fabricating a semiconductor chip according to claim 1,
    wherein a protective film for protecting the semiconductor elements is affixed onto the circuit pattern formation surface of the semiconductor wafer before the masking step; a die bonding tape is affixed to an exterior surface of the film layer after the plasma etching step; and
    the protective film is removed from the circuit pattern formation surface of the semiconductor wafer.

3. The method for fabricating a semiconductor chip according to claim 1, wherein there is performed, after the plasma etching step, processing pertaining to an adhesive strength decreasing step for decreasing adhesive strength acting between the die attach film and the heat-resistant film.

4. The method for fabricating a semiconductor chip according to claim 3, wherein processing pertaining to the adhesive strength decreasing step is performed after removal of the protective film from the circuit pattern formation surface of the semiconductor wafer.

5. The method for fabricating a semiconductor chip according to claim 1, wherein the heat-resistant film is formed from a UV tape.

6. The method for fabricating a semiconductor chip according to claim 1, wherein formation of the boundary trenches in the film layer in the boundary trench formation step is performed by cutting the film layer through use of a laser beam.

7. The method for fabricating a semiconductor chip according to claim 6, wherein processing pertaining to the boundary trench surface smoothing step for smoothing surfaces of the boundary trenches formed in the film layer by means of plasma of an oxygen gas or plasma of a gas mixture containing oxygen as a principal ingredient is performed between the boundary trench formation step and the plasma etching step.

* * * * *